(12) United States Patent
Laws

(10) Patent No.: US 7,038,296 B2
(45) Date of Patent: May 2, 2006

(54) ELECTRICAL COMPONENT STRUCTURE

(75) Inventor: Peter Graham Laws, Wiltshire (GB)

(73) Assignee: Zarlink Semiconductor Limited, (GB)

( * ) Notice: Subject to any disclaimer, the term of this patent is extended or adjusted under 35 U.S.C. 154(b) by 32 days.

(21) Appl. No.: 10/774,032

(22) Filed: Feb. 6, 2004

(65) Prior Publication Data

US 2004/0222494 A1    Nov. 11, 2004

(30) Foreign Application Priority Data

Feb. 6, 2003    (GB) .................................. 0302735.6

(51) Int. Cl.
    *H01L 29/00*    (2006.01)
(52) U.S. Cl. ...................... 257/534; 257/532; 438/396
(58) Field of Classification Search ........ 257/532–534, 257/307–309; 438/396, 398
    See application file for complete search history.

(56) References Cited

U.S. PATENT DOCUMENTS 6,600,209 B1 *   7/2003   Kang et al. ................. 257/535
6,653,681 B1 *  11/2003   Appel ......................... 257/307
6,743,671 B1 *   6/2004   Hu et al. ..................... 438/253
6,794,729 B1 *   9/2004   Mori et al. .................. 257/532
2003/0034546 A1 * 2/2003  Lin et al. .................... 257/532
2003/0222328 A1 * 12/2003 Franson et al. ............. 257/532

FOREIGN PATENT DOCUMENTS

JP        2001-307910 A     11/2001

* cited by examiner

*Primary Examiner*—Tom Thomas
*Assistant Examiner*—N. Drew Richards
(74) *Attorney, Agent, or Firm*—Kilpatrick Stockton LLP

(57) ABSTRACT

An electrical component structure (14) comprises a plurality of overlying substantially parallel layers (15, 16). Each layer (15, 16) provides a lattice (17, 20) comprising a first set of conductive tracks arranged substantially orthogonal to, and electrically connected with, a second set of conductive tracks. Conductive islands (18, 22) are located in windows of the lattices (17, 20), the conductive islands being electrically isolated from the tracks. The lattice (17, 20) of each layer (15, 16) is electrically connected to the conductive islands (22, 18) of the other adjacent layer (16, 15).

12 Claims, 5 Drawing Sheets

KEY:  - Metal Layer (n)

- Metal Layer (n) section

- Via Layer

- Metal Layer (n - I)

- Metal Layer (n -I) section

KEY:  - Metal Layer (n)

- Via Layer

- Metal Layer (n - l)

- Metal Layer (section)

KEY:  - Metal Layer (15)

- Metal Layer (15) section

- Via Layer

- Metal Layer (16)

- Metal Layer (16) section

ELECTRICAL COMPONENT STRUCTURE

CROSS-REFERENCE TO RELATED APPLICATION

This application claims the benefit of UK Patent Application No. 0302735.6 filed Feb. 6, 2003, which is incorporated herein in its entirety by reference.

The present invention relates to an electrical component structure, and particularly, though not exclusively, to an electrical component structure providing a capacitor. The invention also relates to a method of forming an electrical component structure.

BACKGROUND OF THE INVENTION

Electrical components, such as capacitors, are used in electrical circuits to perform particular circuit functions. In integrated circuit (IC) technology, such components are formed using specialised IC processes in which layers of conductive materials, e.g. metal or polysilicon, are deposited on dielectric substrates, e.g. silicon dioxide, the separate conductive layers thereafter being patterned and interconnected using conductive elements, known as 'vias', in order to define particular component structures. The ability to interconnect the patterned conductive layers using vias, whilst maintaining electrical separation using the dielectric substrate, enables complex three-dimensional component structures to be produced with fine resolution.

Typically, a designer will aim to provide structures which are efficient in terms of their compact size, whilst attempting to maximise desirable component properties and minimise parasitic component properties.

In the case of integrated capacitors, which make use of the capacitance between separate electrical nodes, it is desirable to create structures that maximise the capacitance between the nodes. Such capacitors are commonly known as Metal-Oxide-Metal (MOM) capacitors. It is also desirable to create MOM capacitors which can be conveniently scaled and which have minimal parasitic properties, such as resistance and inductance. It will be appreciated that minimising these parasitic properties will improve the quality (Q) factor, and increase the self-resonant frequency, of the capacitor.

A known MOM capacitor structure is shown in FIGS. 1a and 1b. FIG. 1a is a plan view of the capacitor structure 2, whilst FIG. 1b is a cross-sectional view of the capacitor structure, taken along the line X—X shown in FIG. 1a.

Referring to FIG. 1b, it will be noted that the capacitor structure 2 comprises a first metal layer, indicated 'n', and a second metal layer, indicated 'n–1', the second metal layer being located beneath the first layer. The metal layers n, n–1 are substantially coplanar and are separated by a dielectric (not shown).

Referring to FIG. 1a, it will be seen that the first metal layer n provides first and second capacitor terminals 3, 4, the terminals being arranged substantially opposite each other. The first metal layer n also provides a plurality of parallel metal fingers arranged in two interleaved groups 5, 6. For the sake of clarity, only one finger of each group 5, 6 is indicated with a reference numeral. The first group of metal fingers 5 is connected to, and extends rightwards from, the first capacitor terminal 3. However, said metal fingers do not extend as far as the second capacitor terminal 4 and so are electrically isolated therefrom. In a similar manner, the second group of metal fingers 6 is connected to, and extends leftwards from, the second capacitor terminal 4, said metal fingers being electrically isolated from the first capacitor terminal 3.

The second layer n–1 provides a similar arrangement of first and second groups of metal fingers (indicated by the reference numerals 5', 6' to clarify that the fingers are formed by the second layer) which are connected, respectively, to the first and second capacitor terminals 3, 4 of the first layer n. The interconnection between the first and second layers n, n–1 is made in the conventional manner using via connectors 8 which pass through the intervening dielectric layer. Referring to FIG. 1b, it will be noted that the metal fingers are also interleaved in the vertical plane such that metal fingers of the first group 5, 5' are in respective alignment above or below metal fingers of the second group 6, 6'.

In the capacitor structure 2 represented in FIG. 1, the current flow in all fingers lies in the same direction which can result in undesirable inductive effects due to the mutual electromagnetic coupling between adjacent metal fingers. It may also be noted that additional metalisation is required using the via connectors 8 on the end of each finger in order to make the appropriate electrical connection to each capacitor terminal 3, 4.

A further known MOM capacitor structure is represented in FIGS. 2a and 2b. FIG. 2a is a plan view of this known capacitor structure 9, whilst FIG. 2b is a cross-sectional view of the capacitor structure, taken along the line Y—Y shown in FIG. 2a.

Referring to FIG. 2b, as with the capacitor structure 2 described above, the further capacitor structure 9 comprises a first metal layer, indicated 'n' and a second metal layer, indicated 'n–1' the second metal layer being located beneath the first layer. As before, the metal layers n, n–1 are substantially coplanar and are separated by a dielectric (not shown).

Each metal layer n, n–1 provides a plurality of parallel metal fingers, the fingers of successive layers being offset by 90°. The metal fingers of the first and second layers n, n–1 are arranged to form two groups of interconnected fingers 10, 11, the two groups being electrically isolated from each other and connected to respective capacitor terminals (not shown). As FIG. 2a shows, the fingers forming each respective group 10, 11 are interconnected between the two layers n, n–1 in an alternating manner such that, in effect, a woven structure is formed. As before, interconnection between the two layers n, n–1 is achieved using via connectors 8 which are placed at any point where there are overlying fingers belonging to the same group (and so connected to the same capacitor terminal).

Since each layer n, n–1 provides parallel fingers which are connected to different capacitor terminals, some electromagnetic interaction will occur and so undesirable induction effects will again be present. Care is also necessary to ensure a low connection resistance is maintained in connecting the fingers to the appropriate capacitor terminal. The individual resistance of the via connectors 8 can be significant and so current needs to be distributed through, in effect, many parallel paths within the capacitor structure using appropriate terminal connections.

SUMMARY OF THE INVENTION

In one sense, the invention provides an electrical component structure comprising a plurality of overlying substantially parallel layers, each layer providing: a first conductive element having a plurality of windows formed therein; and a plurality of conductive islands disposed within the windows of the conductive element, the conductive islands being electrically isolated from the conductive element, wherein the conductive element of one layer is electrically connected to the conductive islands of an adjacent layer.

According to a first aspect of the present invention, there is provided an electrical component structure comprising a plurality of overlying substantially parallel layers, each layer providing: a lattice comprising a first set of conductive tracks arranged substantially orthogonal to, and electrically connected with, a second set of conductive tracks; and conductive islands located in windows of the lattice, electrically isolated from the tracks thereof, wherein the lattice of one layer is electrically connected to the conductive islands of an adjacent layer.

The above structure is very compact and can be easily scaled by arraying a small cell. The structure also has advantages in applications where it is desirable to minimise inductive effects between otherwise-isolated conductive elements. This is because the current flow in any one conductive element of the lattice will be substantially at right angles to the current flow in any adjacent element not connected to it.

In a preferred embodiment of the invention, intersect regions of the sets of tracks of the lattice of one layer are electrically connected to the conductive islands of an adjacent layer.

The intersect regions may be arranged such that windows of each lattice may have an octagonal shape. The conductive islands may be formed in an octagonal shape. Other shapes may be used in order that the surface area occupied by conductive elements on each layer is maximized. For example, the intersect regions may be arranged such that windows of each lattice are circular. The conductive islands may also be formed in a circular shape so that there is only a small gap between the lattice and the islands.

The layers may be substantially planar, and the electrical connection between the conductive islands of one layer and the intersect regions of an adjacent layer can be established by conductive elements which extend substantially perpendicular to the planes thereof.

Adjacent layers may be separated by a material having a relative dielectric constant greater than one.

The lattice tracks and conductive islands may be formed of metal. Alternatively, the lattice tracks and the conductive islands of one or more layers can be formed of polysilicon material.

The structure may further comprise two electrical terminals, the lattice tracks and conductive islands of each layer being respectively electrically connected to a different one of the electrical terminals. Each electrical terminal may be formed by a metal plate. The metal plates may have apertures formed therein, e.g. to allow air to pass therethrough.

The structure may be arranged to provide a capacitor.

According to a second aspect of the present invention, there is provided an electrical component structure comprising a plurality of overlying substantially parallel planar layers, each layer providing: a lattice comprising a first set of conductive tracks arranged substantially orthogonal to, and electrically connected with, a second set of conductive tracks, crossings of the first and second sets of tracks defining intersect regions; and conductive islands located in windows of the lattice, electrically isolated from the tracks thereof, wherein adjacent layers are offset such that the conductive islands of one layer are superimposed over the intersect regions of the adjacent layer, the lattice intersect points of the layers being electrically connected to the conductive islands of an adjacent layer by interconnecting conductive elements which extend substantially perpendicular to the plane of the layers.

According to a third aspect of the present invention, there is provided a method of forming an electrical component, comprising: (i) forming a plurality of overlying substantially parallel layers, each layer providing (a) a lattice comprising a first set of conductive tracks arranged substantially orthogonal to, and electrically connected with, a second set of conductive tracks, and (b) conductive islands located in windows of the lattice, electrically isolated from the tracks thereof; and (ii) electrically connecting the lattice of one layer to the conductive islands of an adjacent layer.

BRIEF DESCRIPTION OF THE DRAWINGS

The present invention will now be described, by way of example, with reference to the accompanying drawings, in which.

DETAILED DESCRIPTION OF PREFERRED EMBODIMENTS

Figure 1B:
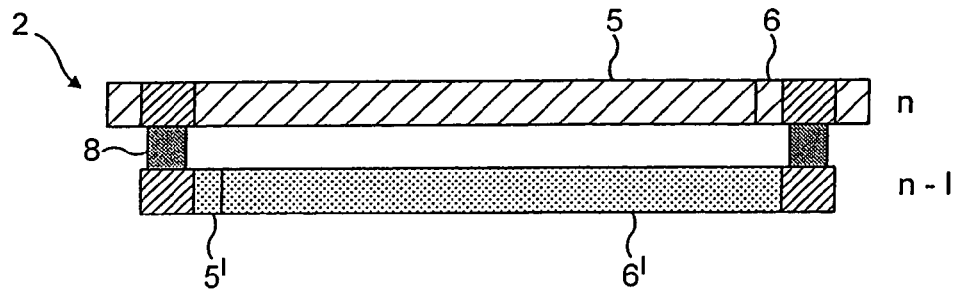
FIG. 1 comprises FIGS. 1a and 1b, which are, respectively, plan and cross-sectional views of a prior art capacitor structure.
Figure 1A:
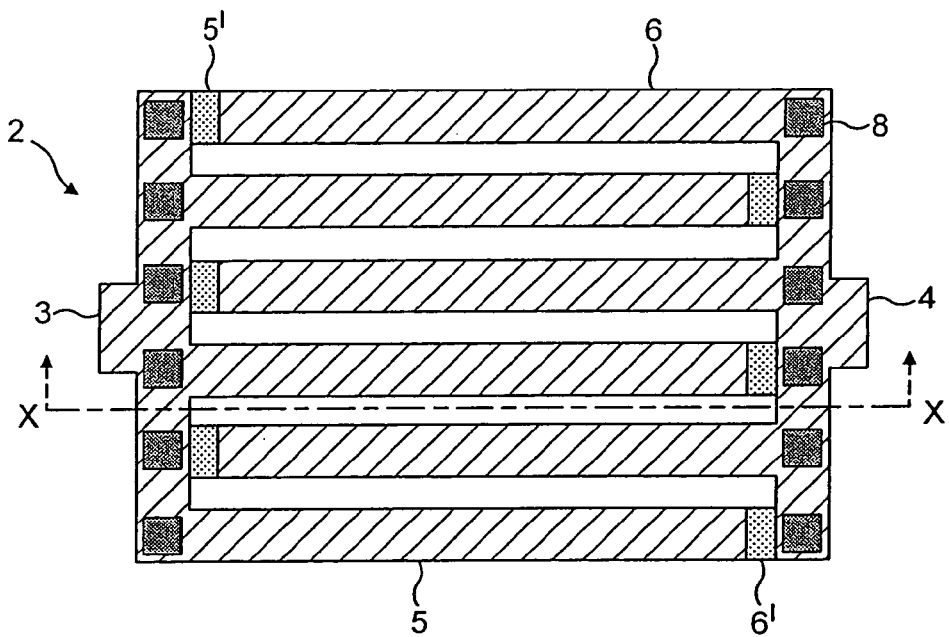
Figure 1:
Figure 1:
Figure 1:
Figure 1:
Figure 1:
Figure 2B:
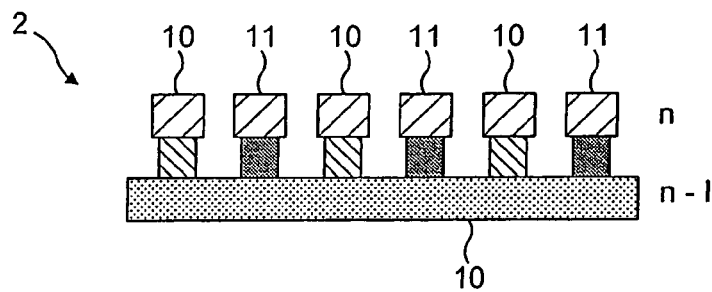
FIG. 2 comprises FIGS. 2a and 2b, which are, respectively, plan and cross-sectional views of a second prior art capacitor structure.
Figure 2A:
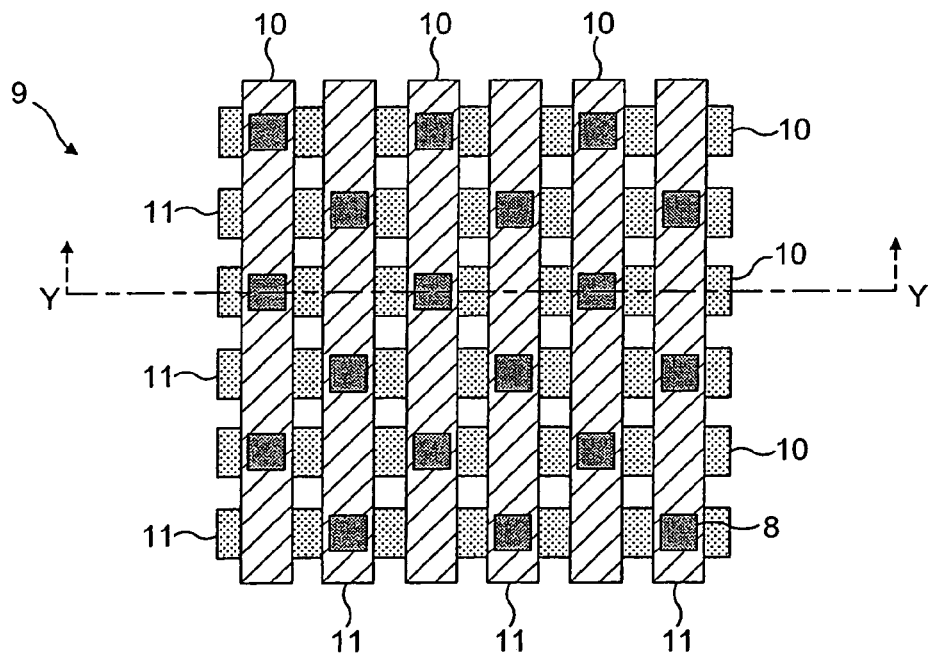
Figure 2:
Figure 2:
Figure 2:
Figure 2:
Figure 3B:
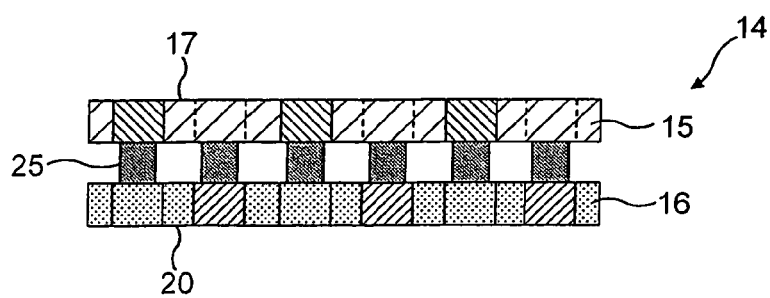
FIG. 3 comprises FIGS. 3a and 3b, which are, respectively, plan and cross-sectional views of part of a MOM capacitor structure according to a preferred embodiment of the invention.
Figure 3A:
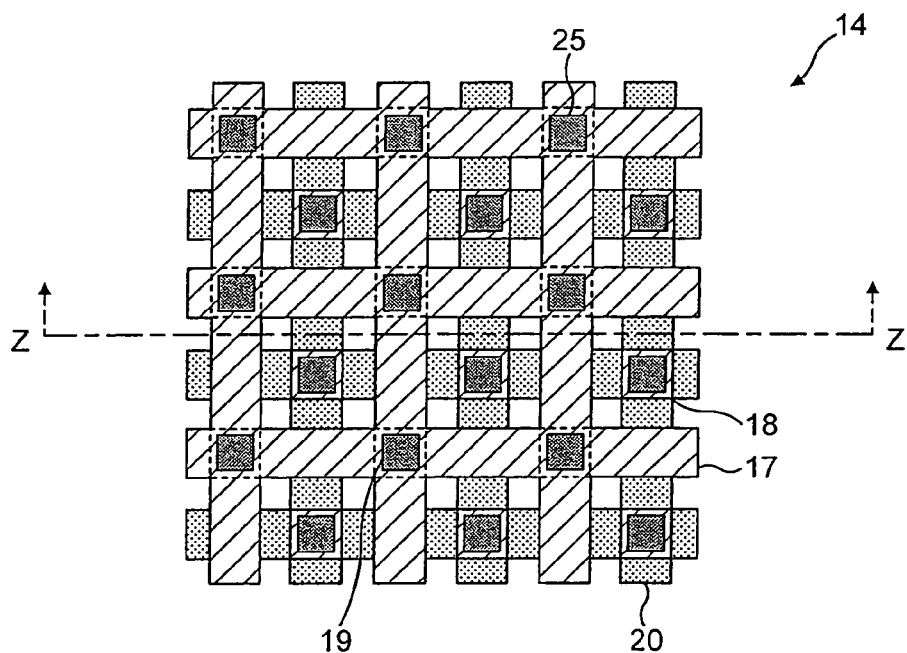
Figure 3:
Figure 3:
Figure 3:
Figure 3:
Figure 3:

Referring to FIGS. 3a and 3b, a MOM capacitor structure 14 comprises first and second substantially parallel layers 15, 16, the second layer being arranged below the first layer. It should be understood that only part of each layer 15, 16 is actually shown in the drawings. However, the overall structure of each layer 15, 16 is regular and repeats in all directions up to boundary edges of each layer (not shown). Between each of the first and second layers 15, 16 there is provided a dielectric substrate (not shown) which can be made of, for example, silicon dioxide. Each of the first and second layers 15, 16 provides a predetermined pattern of conductive elements, the elements of each layer being interconnected in a predetermined manner to form the capacitor structure 14.

The arrangement of each of the first and second layers 15, 16, and the interconnections between these layers, will now be explained with reference to FIGS. 4a and 4b.

Figure 4B:
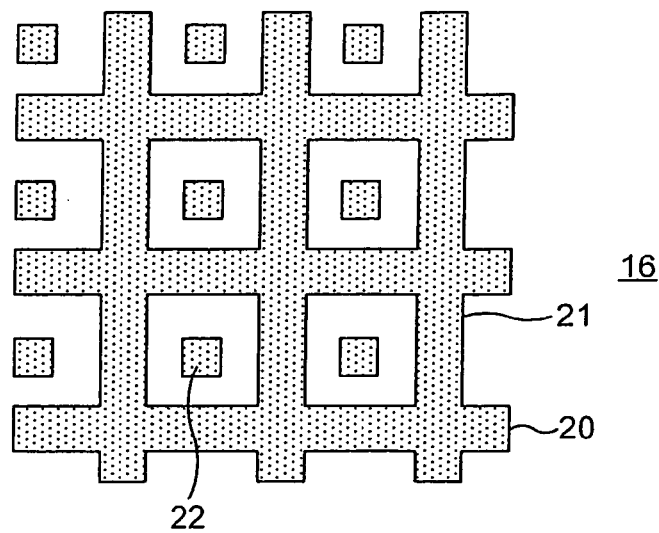
FIGS. 4a and 4b are plan views showing, separately, respective first and second layers of the MOM capacitor structure represented in FIGS. 3a and 3b.
Figure 4A:
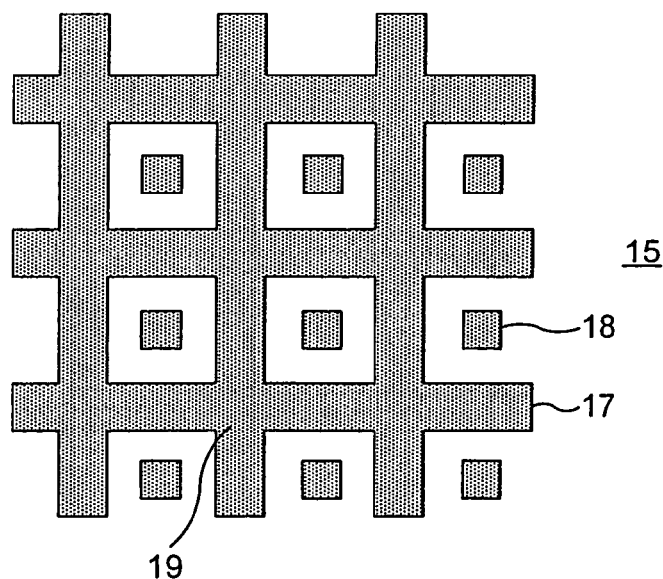

Referring to FIG. 4a, the first layer 15 of the capacitor structure 14 provides a conductive lattice 17 made up of a first set of conductive tracks arranged substantially orthogonal to a second set of conductive tracks, crossings of the first and second sets of tracks defining intersect regions 19. The first layer 15 also provides conductive islands 18 within each window of the lattice 17, that is to say in the spaces between the orthogonal tracks thereof. The conductive islands are electrically isolated from the lattice.

Referring now to FIG. 4b, the second layer 16 of the capacitor structure 15 has a similar structure to that of the first layer 15. Indeed, the second layer 16 provides a conductive lattice 20 made up of a first set of conductive tracks arranged substantially orthogonal to a second set of conductive tracks, crossings of the first and second sets of tracks defining intersect regions 21. As with the first layer 15, conductive islands 22 are provided within each window of the lattice 20, the conductive islands being electrically isolated from the lattice. The main difference between the first and second layers 15, 16 lies in the relative positions of the different conductive elements, as will be explained fully below.

Referring back to the capacitor structure 14 shown in FIGS. 3a and 3b, it will be noted that the relative positions of the two layers 15, 16 are arranged such that intersect regions 19 of the first layer 15 substantially overlie the conductive islands 22 of the second layer 16 (the conductive islands therefore being hidden from view in FIG. 3a). Similarly, the conductive islands 18 of the first layer 15 substantially overlie the intersect regions 21 of the second layer 16 (the intersect regions therefore being hidden from view in FIG. 3a).

The capacitor structure 14 is completed by establishing electrical connections between the intersect regions 19, 21 and the respective conductive islands 18, 22 over or under which they are positioned. This is done using via connectors 25 which pass between the first and second layers 15, 16, i.e. through the intervening dielectric material, substantially transverse to the plane of the layers.

It will be appreciated that the capacitor structure 14 comprises two groups of interconnected conductive elements, the groups being electrically isolated from each another. The first group comprises the lattice 17 of the first layer 15, the conductive islands 22 of the second layer 16, and the via connectors 25 therebetween. The second group comprises the lattice 20 of the second layer 16, the conductive islands 18 of the first layer 15, and the via connectors 25 therebetween. Thus, the conductive elements of each group extend in three dimensions, i.e. along the orthogonal tracks of each lattice 17, 20 and also vertically between the first and second layers 15, 16. Each group of conductive elements is connected to a respective capacitor terminal (not shown).

An advantageous feature of the above-described capacitor structure 14 is that current in any conductive element will flow substantially at right angles with respect to current flow in any adjacent conductive element not connected to the same capacitor terminal. Accordingly, there is minimal electromagnetic interaction between the conductive elements of the different groups, and inductive parasitic effects are reduced. A further feature is that current can be distributed over a wide surface area using the lattices 17, 20 of each layer 15, 16 which do not require via connectors 25 to establish conductivity in the plane of each layer. Since the via connectors 25 will have some resistive characteristics, this will minimise the overall resistance within the structure. Furthermore, the overall capacitor structure 14 is efficient in terms of its size, and can be conveniently scaled by arraying a small cell.

The lattices 17, 20 and the islands 18, 22 of each layer 15, 16 can be formed of any conductive material, such as metal or polysilicon.

Figure 5:
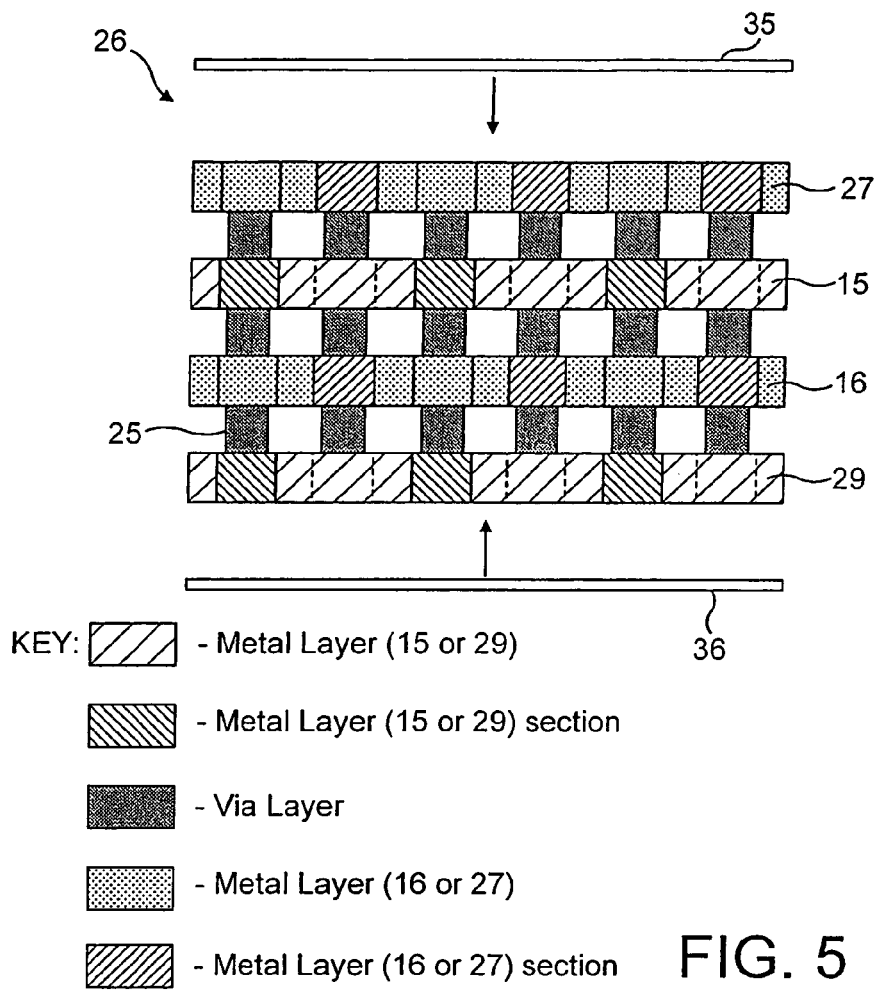
FIG. 5 is a cross-sectional view of a four-layer MOM capacitor structure.

Although the above described capacitor structure 14 comprises two layers 15, 16, one or more further layers can be added. Referring to FIG. 5, which shows a four-layer capacitor structure 26, it will be seen that, as well as the first and second layers 15, 16 described above, the capacitor structure includes third and fourth layers 27, 29. The third layer 27 is arranged above the first layer 15, and the fourth layer 29 is arranged below the second layer 16. In terms of the arrangement and alignment of conductive elements, the third layer 27 is identical to the second layer 16, and the fourth layer 29 is identical to the first layer 15. Reference is again made to FIGS. 4a and 4b which show the respective layouts of the elements.

As with the capacitor structure 14 shown in FIGS. 4a and 4b, interconnections are made between adjacent layers. Thus, intersect points of the lattice (not shown) of the third layer 27 are electrically connected to the conductive islands 18 of the first layer 15, and conductive islands (not shown) of the third layer 27 are electrically connected to the intersect points 19 of the lattice 17 of the first layer. Also, intersect points of the lattice (not shown) of the fourth layer 29 are connected to the conductive islands 22 of the second layer 16, and conductive islands (not shown) of the fourth layer are connected to the intersect points 21 of the lattice 20 of the second layer 16. Again, the connections between adjacent layers are made using metal via connectors 25. As a result, it will be appreciated that the lattices of the first and fourth layers 15, 29 are connected together by means of via connections extending from the intersect regions of each lattice to the conductive islands 22 of the second layer 16. Similarly, the lattices of the second and third layers 16, 27 are connected together by means of via connectors 25 extending from the intersect regions of each lattice to the conductive islands 18 of the first layer 15. Accordingly, two groups of interconnected conductive elements are provided, the groups being electrically isolated from each other. The capacitor structure 26 effectively comprises two three-dimensional matrices which are interwoven. First and second capacitor terminals (not shown) can be connected, respectively, to the first and second groups of conductive elements.

The capacitor structure 26 shown in FIG. 5 has the same advantageous characteristics as the capacitor structure 14 shown in FIGS. 3a and 3b. Undesirable inductive effects are kept to a minimum and the effect of via resistance is kept low. Although a larger number of conductive elements make up the capacitor structure 26, the arrangement of elements and interconnections provides a very compact structure for the value of capacitance provided. Indeed, the capacitor structure 26 can be extended even further in the vertical direction by adding additional layers. As will be appreciated, alternate layers will be identical in terms of their relative arrangement of conductive elements.

Figure 6:
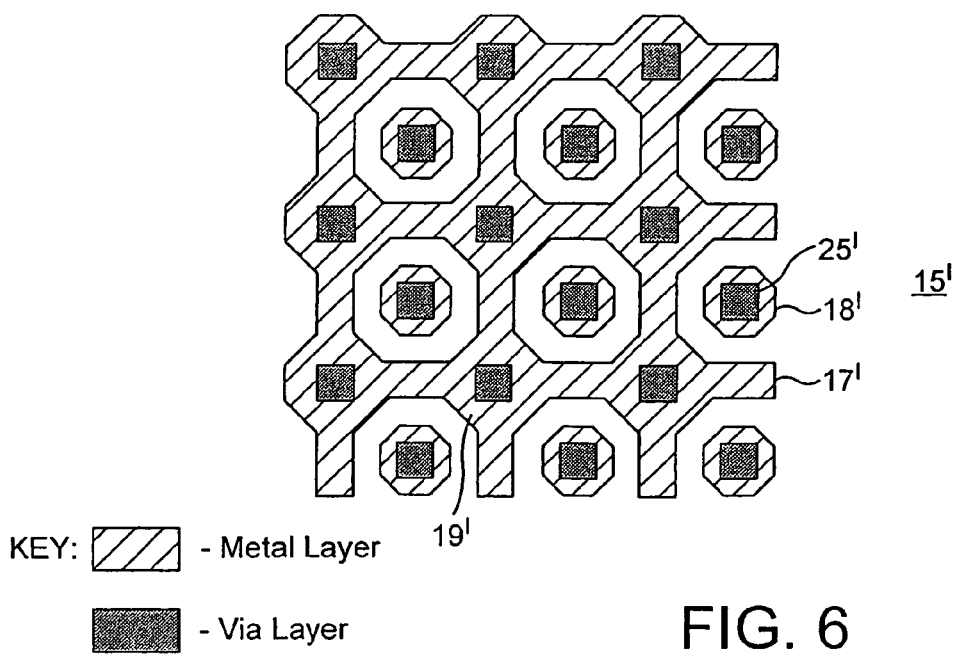
FIG. 6 is a plan view of one layer of a MOM capacitor structure, the layer providing a modified arrangement of conductive elements.

The arrangement of conductive elements forming each layer 15, 16, 27, 29 can be modified to maximise the capacitance (per unit area) of the capacitor structures 14, 26. Referring to FIG. 6, a modified version of the first layer 15 (described above) is shown. The modified layer is indicated with the reference numeral 15'. The modified layer 15' provides a lattice 17' made up of first and second sets of orthogonal tracks, the crossings of the lattice defining intersect regions 19'. However, it will be noted that the windows of the lattice 17' have an octagonal shape since the intersect regions 19' are formed with beveled edges. Within each octagonal window is an octagonal conductive island 18' which is electrically isolated from the lattice 17'. A via connector 25 is shown on top of each conductive island 18'. The arrangement aims to maximise the amount of conductive material forming the modified layer 15' and so the capacitance (per unit area). Further refinement can take place using other arrangements, for example by providing circular lattice windows and circular conductive islands within each window.

In order to provide first and second capacitor terminals for the capacitor structures 14, 26 described above, metal plates 35, 36 can be placed adjacent the upper and lower layers of the structure. Each metal plate 35, 36 can then be connected, using via connectors 25, to the layer adjacent thereto such that they are connected to elements which are isolated from each other. In the case of the capacitor structure shown in FIG. 5, for example, one metal plate 35 can be connected to the conductive islands 22 of the third layer 27 whilst the other metal plate 36 can be connected to the lattice intersect regions 19 of the fourth layer 29. The use of metal plates may be beneficial in IC applications where the top layer is not capable of meeting the fine geometry design rules that the lower layers can support. The metal plates 35, 36 need not be continuous and can include, for example, apertures formed so as to allow air to pass therethrough.

It is also possible to use silicon (by means of appropriate doping to render the silicon conductive) effectively to form one or both capacitor terminals. For example, it may be preferable to form the capacitor terminal, at the bottom of the capacitor structure, using polysilicon material.

As mentioned above, the conductive elements of the layers can be formed of metal. Alternatively, polysilicon can be used, particularly if silicide is used to improve its conductivity properties.

The above-described capacitor structures 14, 26 can be implemented in different types of technologies, including conventional IC technologies, and multi-layer printed circuit board technologies (where multiple conductive patterned layers can be created with the provision of through-plated layer interconnection points, or vias)

What is claimed is:

1. An electrical component structure comprising: a plurality of overlying substantially parallel layers, each layer comprising: a lattice comprising a first set of conductive tracks arranged substantially orthogonal to, and electrically connected with, a second set of conductive tracks; and conductive islands located in windows of the lattice, electrically isolated from the tracks thereof, wherein intersect regions of the sets of tracks of the lattice of one layer are electrically connected to the conductive islands of an adjacent layer.

2. A structure according to claim 1, wherein the intersect regions of the lattice are arranged such that the windows of each lattice have an octagonal shape.

3. A structure according to claim 1, wherein the conductive islands have an octagonal shape.

4. A structure according to claim 1, wherein the layers are substantially planar, and the electrical connection between the conductive islands of one layer and the lattice of an adjacent layer is established by conductive elements which extend substantially perpendicular to the planes thereof.

5. A structure according to claim 1, wherein adjacent layers are separated by a material having a relative dielectric constant greater than one.

6. A structure according to claim 1, wherein the lattice tracks and conductive islands are formed of metal.

7. A structure according to claim 1, wherein the lattice tracks and the conductive islands of one or more layers are formed of polysilicon material.

8. A structure according to claim 1, comprising two electrical terminals, the lattice tracks and conductive islands of each layer being respectively electrically connected to a different one of the electrical terminals.

9. A structure according to claim 8, wherein each electrical terminal is formed by a metal plate.

10. A structure according to claim 1, wherein the structure provides a capacitor.

11. An electrical component structure comprising: a plurality of overlying substantially parallel planar layers, each layer comprising: a lattice comprising a first set of conductive tracks arranged substantially orthogonal to, and electrically connected with, a second set of conductive tracks, crossings of the first and second sets of tracks defining intersect regions; and conductive islands located in windows of the lattice, electrically isolated from the tracks thereof; wherein adjacent layers are offset such that the conductive islands of one layer are superimposed over the intersect regions of the adjacent layer, the lattice intersect points of the layers being electrically connected to the conductive islands of an adjacent layer by interconnecting conductive elements which extend substantially perpendicular to the plane of the layers.

12. A method of forming an electrical component, comprising:
  (i) forming a plurality of overlying substantially parallel layers, each layer providing (a) a lattice comprising a first set of conductive tracks arranged substantially orthogonal to, and electrically connected with, a second set of conductive tracks, and (b) conductive islands located in windows of the lattice, electrically isolated from the tracks thereof; and
  (ii) electrically connecting intersect regions of the sets of tracks of the lattice of one layer to the conductive islands of an adjacent layer.

* * * * *